(12) United States Patent
Ori

(10) Patent No.: US 6,400,745 B1
(45) Date of Patent: Jun. 4, 2002

(54) LASER RADIATING OPTICAL SYSTEM

(75) Inventor: Yuichiro Ori, Moriyama (JP)

(73) Assignee: Minolta Co., Ltd., Osaka (JP)

( * ) Notice: Subject to any disclaimer, the term of this patent is extended or adjusted under 35 U.S.C. 154(b) by 63 days.

(21) Appl. No.: 09/678,258

(22) Filed: Oct. 3, 2000

(30) Foreign Application Priority Data

Oct. 27, 1999 (JP) ............................................ 11-305130

(51) Int. Cl.⁷ ................................................. H01S 3/08
(52) U.S. Cl. ......................................... 372/101; 372/99
(58) Field of Search .................... 372/101, 99; 459/566

(56) References Cited

U.S. PATENT DOCUMENTS 5,148,317 A * 9/1992 Foresi ......................... 459/566

* cited by examiner

Primary Examiner—Leon Scott, Jr.
(74) Attorney, Agent, or Firm—Burns, Doane, Swecker & Mathis, LLP

(57) ABSTRACT

A laser radiating optical system is composed of a laser diode and two mutually independent shaping optical systems. The laser diode emits a laser beam that has a Gaussian intensity distribution and that diverges with a large divergence angle in a first direction and with a small divergence angle in a second direction perpendicular to the first direction. The first shaping optical system makes the intensity distribution even with respect to the first direction, and the second shaping optical system makes the intensity distribution even with respect to the second direction. The shaping optical systems are each composed of a collimator lens and a diffractive element for shaping, and the diffractive elements of the two shaping optical systems are given substantially equal numerical apertures.

9 Claims, 11 Drawing Sheets

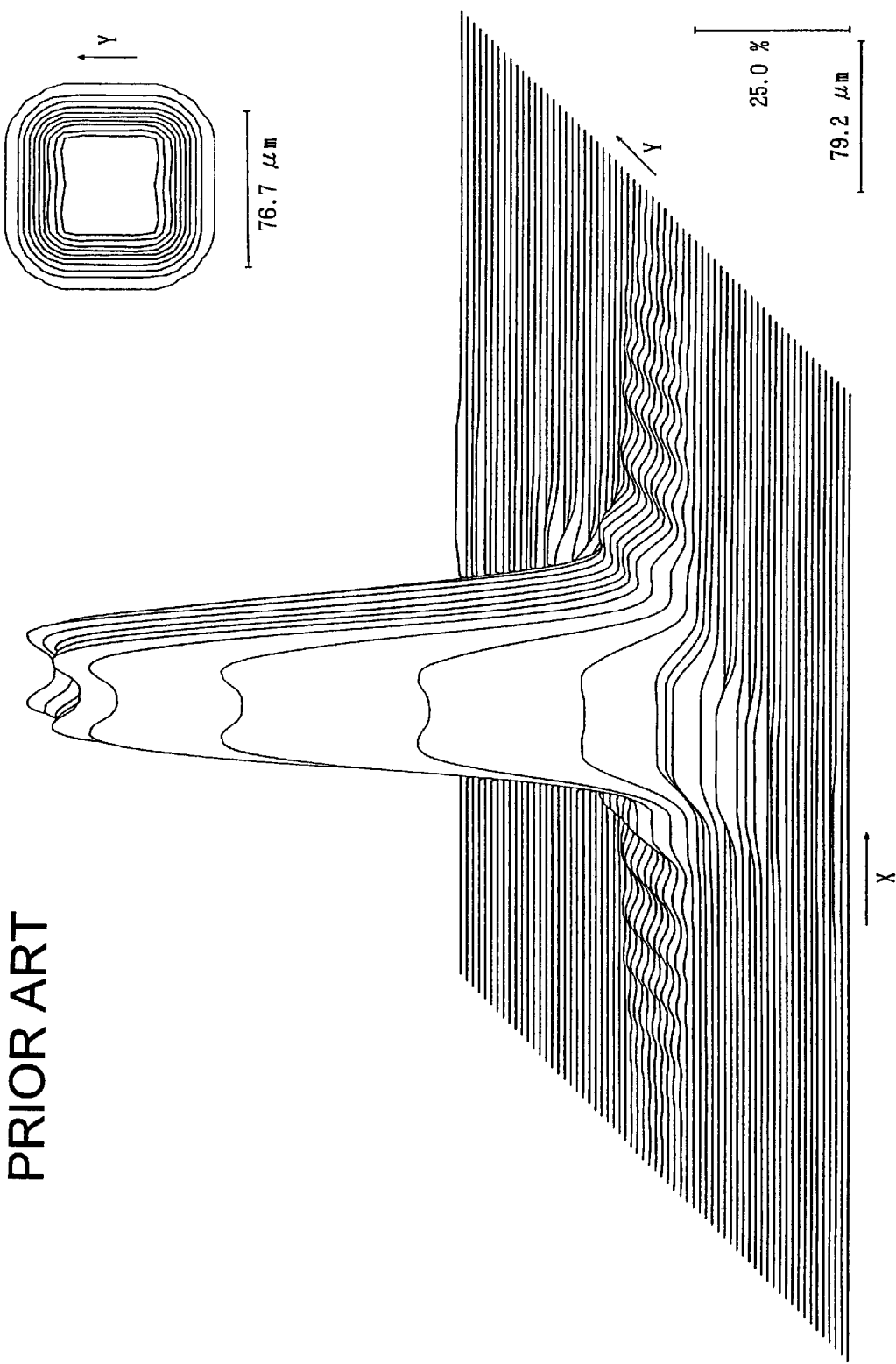

LASER RADIATING OPTICAL SYSTEM

This application is based on application No. H11-305130 filed in Japan on Oct. 27, 1999, the entire contents of which are hereby incorporated by reference.

BACKGROUND OF THE INVENTION

1. Field of the Invention

The present invention relates to a laser radiating optical system that shapes a laser beam having an uneven intensity distribution emitted from a light source in such a way as to obtain an even intensity distribution on an irradiation target surface, and in particular to a laser radiating optical system that shapes a laser beam that diverges from a light source in an anisotropic fashion.

2. Description of the Prior Art

Laser beams are characterized by offering high intensity with small beam widths, and are widely used in minuscule machining operations on the surfaces of materials and in data transfer through optical fibers. As light sources that emit laser light, various types are known such as gas lasers as exemplified by carbon dioxide lasers, solid lasers as exemplified by YAG lasers, and semiconductor lasers as exemplified by laser diodes. Any laser light source emits a laser beam that has an uneven intensity distribution, specifically a Gaussian intensity distribution in the single mode.

In machining operations of materials, an object is machined into the shape corresponding to the intensity distribution of the laser beam used. Therefore, the laser beam needs to be controlled so as to exhibit a desired intensity distribution on the object according to the shape into which the object is to be machined. For example, to form a hole having a square cross section and having a uniform depth in the surface of an object, it is necessary to use a laser beam that has a square outline on the sectional plane perpendicular to the optical path and that has an even intensity distribution on that sectional plane. Moreover, the minimum machinable area depends on the beam width of the laser beam used, and therefore it is necessary to give the laser beam a beam width according to the machining precision required. In general, the beam width required in high-precision machining is about a few tens of microns.

When a laser beam is used in data transfer through an optical fiber, which typically has a diameter of a few microns, it is necessary to minimize the loss of laser light by making the beam width still smaller. In addition, an optical fiber has an individual light propagation mode, and a laser beam propagated through an optical fiber has a Gaussian intensity distribution in the single mode. For this reason, if a laser beam emitted from a light source that exhibits a Gaussian intensity distribution is made to have a minuscule beam width simply by being made to converge, it occurs that very little of the laser beam is propagated through the optical fiber when the intensity distribution of the laser beam and the intensity distribution that can be propagated through the optical fiber are out of phase. Moreover, as temperature varies, the degree to which they are out of phase varies, and accordingly the data transferred also varies. This makes it impossible to achieve the desired function.

To prevent this inconvenience, it is necessary to reduce the error in the position at which a laser beam is shone into an optical fiber to about one-tenth of the fiber diameter or less. This requires that the optical fiber and the optical system that directs the laser beam at the optical fiber be positioned precisely relative to each other and that their positions be fixed so as not to vary with temperature. Thus, their alignment requires much time and also a high-precision fixture.

In machining of materials, a laser radiating optical system is used, which is provided with a shaping optical system that makes a laser beam emitted from a light source converge and that converts the intensity of the laser beam in such a way that an even intensity distribution is obtained at the position at which the laser beam converges. Also in data transfer through optical fibers, such a laser radiating optical system can be used so that a laser beam having an even intensity distribution and having a beam width somewhat greater than the fiber diameter is directed to an optical fiber. This makes it possible to keep constant the intensity of the laser beam propagated through the optical fiber even when a small error occurs in the position, relative to the optical fiber, at which the laser beam converges, and is thus expected to make their alignment and fixing easier.

When the aperture through which a light source emits a laser beam is not much different from the wavelength of the laser beam, diffraction occurs in the laser beam traveling out of the aperture and forms the laser beam into a divergent beam that fans out in a conical shape. With gas or solid lasers, the aperture is circular or square, and therefore the laser beam diverges in an isotropic fashion so as to have a substantially circular cross section. Thus, in a laser radiating optical system that employs a gas or solid laser as a light source, it is possible to obtain an even intensity distribution by the use of a shaping element that has an isotropic shaping characteristic.

Usually, to facilitate intensity conversion achieved by a shaping element, a divergent beam emitted from a light source is formed into a parallel beam beforehand by the use of a collimator lens. The shaping element makes the parallel beam converge to make its beam width smaller, and simultaneously converts the intensity distribution of the laser beam so that an even intensity distribution is obtained at the position at which the laser beam converges.

On the other hand, a laser diode has a structure in which a thin active layer is laid between cladding layers so that a laser beam is emitted from a side face of the active layer, and thus has a rectangular aperture. As a result, the angle of diffraction of the laser beam traveling out of the aperture is large in the direction of the shorter sides of the aperture (i.e. in the direction in which the semiconductor layers are laid over one another) and small in the direction of the longer sides thereof. Thus, the laser beam diverges in an anisotropic fashion so as to have an oval cross section. For example, a typical laser diode emits a laser beam whose vertical angle is about 25° in the direction of the shorter sides of the aperture and about 10° in the direction of the longer sides thereof. Quite naturally, with a laser beam that diverges in an anisotropic fashion, whenever it exhibits a Gaussian intensity distribution, its intensity also is distributed in an anisotropic fashion.

However, in a conventional laser radiating optical system, even when a laser diode is used as a light source, no consideration is given to the fact that the laser beam diverges in an anisotropic fashion. That is, even then, the laser beam is formed into a parallel beam by the use of an isotropic collimator lens, and then its intensity distribution is converted by the use of an isotropic shaping element. As a result, some anisotropy remains even at the position at which the laser beam converges, and thus the range in which an even intensity distribution is obtained differs greatly between two mutually perpendicular directions. Accordingly, in applications where a laser beam having an even intensity distribution is shone onto a region extending equally in two mutually perpendicular directions, only part of the area in which an even intensity distribution is obtained is used, and the remaining part is discarded. Thus, the laser light is utilized with quite low efficiency.

This inconvenience is alleviated by using an anisotropic shaping element instead of an isotropic shaping element. However, the shaping performance of a shaping element that serves to make the intensity distribution of a laser beam even depends heavily on the numerical aperture at the exit side of the shaping element. Therefore, even if an anisotropic shaping element is used, it is extremely difficult to make the intensity distribution satisfactorily even in both of two mutually perpendicular directions. This is because, whereas the beam width of the laser beam entering the shaping element differs between two mutually perpendicular directions, the distance from the shaping element to the convergence position is fixed, and therefore the shaping element cannot have equal numerical apertures in two mutually perpendicular directions.

Now, the relationship between the numerical aperture of a shaping element and the intensity distribution obtained as a result of shaping will be described, taking up an isotropic laser beam as an example. When a laser beam having a comparatively large width and having an intensity distribution as shown in FIG. 10 is made to converge at a convergence position a predetermined distance away from a shaping element as a laser beam having a square cross section and having an even intensity distribution, the obtained intensity distribution is as shown in FIGS. 11A and 11B. In this way, a laser beam having a large width is formed into a laser beam of which the intensity drops abruptly in its peripheral portion and which thus exhibits sharp intensity variation. Accordingly, an even intensity distribution is obtained in a large area, and thus the laser light is utilized with high efficiency.

By contrast, when a laser beam having a comparatively small width and having an intensity distribution as shown in FIG. 12 is made to converge at a convergence position the same distance away from a shaping element as in the above-described example as a laser beam having the same cross-sectional size and having an even intensity distribution, the obtained intensity distribution is as shown in FIGS. 13A and 13B. In this way, a laser beam having a small width is formed into a laser beam of which the intensity drops gradually in its peripheral portion and which thus exhibits dull intensity variation. Accordingly, an even intensity distribution is obtained only in a small area, and thus the laser light is utilized with low efficiency.

In both of these examples, the shaping element is optimized for the intensity distribution shown in FIGS. 10 and 12 respectively. Even with a shaping element having an optimized shaping characteristic like this, unsatisfactory shaping performance results if the beam width as observed on the shaping element, and thus the numerical aperture there, is small. When a laser beam that diverges in an anisotropic fashion is shaped by the use of a single shaping element, even if the shaping element is an anisotropic one, it is inevitable that shaping performance is unsatisfactory in the direction in which the laser beam has a smaller beam width.

When a laser beam that diverges in an anisotropic fashion is shaped by the use of an isotropic shaping element, the degradation of shaping performance is more striking. An example of the intensity distribution obtained at the convergence position with a shaping element optimized in the direction in which the laser beam has a larger beam width is shown in FIGS. 14A and 14B. In this example, in the direction in which the laser beam has a smaller beam width, there is almost no range in which an even intensity distribution is obtained. Conversely, although not illustrated, when a shaping element optimized in the direction in which the laser beam has a smaller beam width is used, shaping performance is unsatisfactory in the direction in which the laser beam has a larger beam width.

SUMMARY OF THE INVENTION

An object of the present invention is to provide a laser radiating optical system that efficiently converts a laser beam that has an uneven intensity distribution and that diverges in an anisotropic fashion into a laser beam having an even intensity distribution on an irradiation target surface.

To achieve the above object, according to one aspect of the present invention, a laser radiating optical system is composed of a laser light source that emits a laser beam having different vertical angles in mutually perpendicular first and second directions and having an uneven intensity distribution, a first shaping optical system, and a second shaping optical system.

The first shaping optical system includes a first collimator lens that forms the laser beam exiting from the laser light source into a parallel beam with respect to the first direction and a first shaping element that converts the intensity distribution of the laser beam exiting from the first collimator lens with respect to the first direction and that simultaneously makes this laser beam converge at a convergence position a predetermined distance away from the laser light source with respect to the first direction. The second shaping optical system includes a second collimator lens that forms the laser beam exiting from the laser light source into a parallel beam with respect to the second direction and a second shaping element that converts the intensity distribution of the laser beam exiting from the second collimator lens with respect to the second direction and that simultaneously makes this laser beam converge at a convergence position a predetermined distance away from the laser light source with respect to the second direction.

The laser beam emitted from the laser light source has an uneven intensity distribution and diverges in an anisotropic fashion. The first shaping optical system acts on this laser beam only with respect to the first direction, and does not affect it with respect to the second direction. Similarly, the second shaping optical system acts on the laser beam emitted from the laser light source only with respect to the second direction, and does not affect it with respect to the first direction. Accordingly, the first and second shaping optical systems can be designed independently of each other. It is possible to design the first and second shaping optical systems in such a way that they make the laser beam converge at identical convergence positions, i.e. that the laser beam is made to converge at a common convergence position in the first and second directions.

By designing the first and second shaping optical systems according to the vertical angles of the laser beam, i.e. the degrees to which the laser beam diverges, in the first and second directions respectively, it is possible to make the laser beam have substantially the same beam width in the first and second directions at the common convergence position and have an even intensity distribution both in the first and second directions at the convergence position. Moreover, it is possible to shape the entire laser beam emitted from the laser light source, and thus make an efficient use of the laser light.

In this laser radiating optical system, if the laser beam emitted from the laser light source is assumed to have a larger vertical angle in the first direction than in the second direction, it is preferable to dispose the first shaping optical system between the laser light source and the second shaping optical system. By converting the intensity distribution first with respect to the first direction, in which the degree of diversion is greater, and then with respect to the second direction, in which the degree of diversion is smaller, it is possible to make the first and second shaping optical systems have substantially equal numerical apertures at their exit sides with respect to the common convergence position, and thereby make them exhibit substantially equal performance in terms of intensity conversion and convergence. This helps make the intensity distribution at the common convergence position substantially the same in the first and second directions and thereby enhance evenness of intensity.

Moreover, it is preferable to design the laser radiating optical system to fulfill the relationship represented by formula (1) below.

$$0.8 \leq \beta \cdot fL1 \cdot fD2/(fL2 \cdot fD1) \leq 1.25 \quad (1)$$

Here, fL1 represents the focal length of the first collimator lens, fL2 represents the focal length of the second collimator lens, fD1 represents the focal length of the first shaping element, and fD2 represents the focal length of the second shaping element. Moreover, assuming that the laser beam emitted from the laser light source has a vertical angle θ1 in the first direction and a vertical angle θ2 in the second direction, β is defined as β=tan (θ1/2)/tan (θ2/2).

Formula (1) defines the range of the ratio of the numerical aperture of the first shaping optical system to the numerical aperture of the second shaping optical system on the basis of the difference between the degrees to which the laser beam diverges in the first and second directions. When the central part of formula (1) is equal to 1, the first and second shaping optical systems have equal numerical apertures, and thus the intensity distribution of the laser beam at the common convergence position is the same in the first and second directions. When formula (1) is fulfilled, there is no significant difference between the numerical apertures of the two shaping optical systems, and accordingly the intensity distribution at the convergence position is kept satisfactorily even.

The laser radiating optical system may be additionally provided with an optical system that makes the laser beam having traveled past the convergence position converge once again. This makes it possible to make the laser beam, already made even at the convergence position, have a still smaller beam width while maintaining the evenness thereof.

BRIEF DESCRIPTION OF THE DRAWINGS

This and other objects and features of the present invention will become clear from the following description, taken in conjunction with the preferred embodiments with reference to the accompanying drawings in which:

FIGS. 13A and 13B are a three-dimensional representation and a contour map (at 9.1% intervals), respectively, of the intensity distribution of the laser beam shown in FIG. 12 as observed at the convergence position.

DESCRIPTION OF THE PREFERRED EMBODIMENTS

Figure 1:
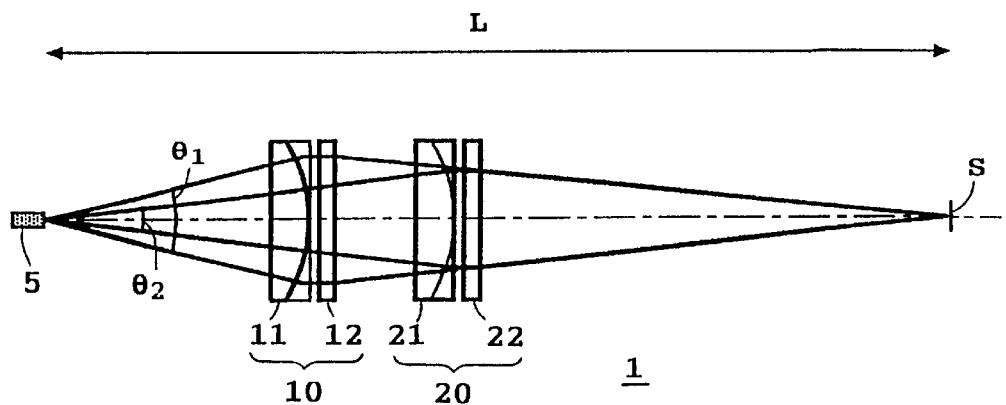
FIG. 1 is a superimposed diagram of sectional views, perpendicular to the first and second directions, of the laser radiating optical system of a first embodiment of the invention.
Figure 2A:
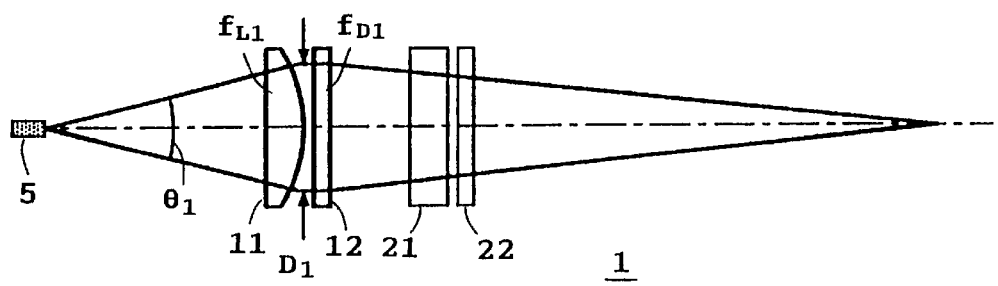
FIGS. 2A and 2B are sectional views, perpendicular to the second and first directions respectively, of the laser radiating optical system of the first embodiment.
Figure 2B:
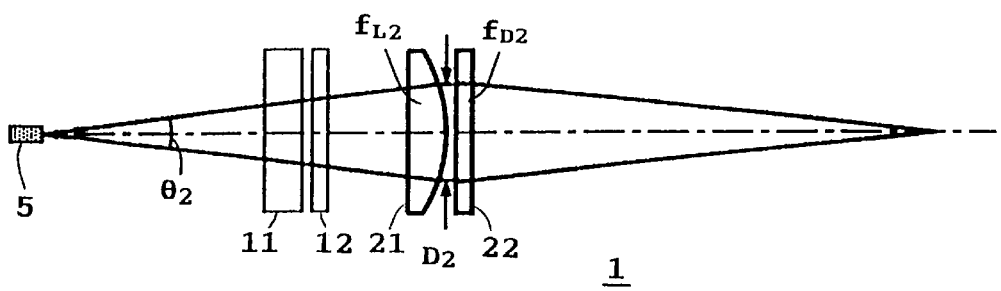

Hereinafter, laser radiating optical systems embodying the present invention will be described with reference to the drawings. FIGS. 1, 2A, and 2B schematically show the outline of the construction of the laser radiating optical system 1 of a first embodiment of the invention and the principle of how a laser beam is shaped therein. The laser radiating optical system 1 is provided with a laser diode (LD) 5 serving as a light source, a first shaping optical system 10, and a second shaping optical system 20. The laser diode 5 emits a laser beam, which is then made to converge, by the shaping optical systems 10 and 20, at a convergence position S a predetermined distance from the LD 5 as a laser beam having a predetermined cross-sectional outline and having an even intensity distribution. The distance from the LD 5 to the convergence position S is represented by L. The first shaping optical system 10 is disposed between the LD 5 and the second shaping optical system 20.

The LD 5 emits a laser beam having a Gaussian intensity distribution in the form of a divergent beam that fans out in a conical shape. The LD 5 has a rectangular aperture of which the shorter sides extend in the direction in which the semiconductor layers are laid over one another. Hereafter, the direction parallel to the shorter sides of the aperture of the LD 5 will be referred to as the first direction, and the direction parallel to the longer sides of the aperture of the LD 5 will be referred to as the second direction. The first and second directions are perpendicular to each other. FIG. 2A is a sectional view perpendicular to the second direction, and FIG. 2B is a sectional view perpendicular to the first direction. FIG. 1 is a superimposed diagram of the sections perpendicular to the first and second directions.

The laser beam emitted from the LD 5 has a large vertical angle in the first direction and a small vertical angle in the second direction. The vertical angle of the laser beam emitted from the LD 5 as observed in the first direction is represented by θ1, and the vertical angle thereof as observed in the second direction is represented by θ2.

The first shaping optical system 10 is composed of a first collimator lens 11 and a first diffractive optical element (DOE) 12 serving as a first shaping element. The second shaping optical system 20 is composed of a second collimator lens 21 and a second diffractive optical element (DOE) 22 serving as a second shaping element.

The first and second collimator lenses 11 and 21 are both cylindrical lenses, and are arranged perpendicularly to the optical axis of the LD 5 (i.e. the principal ray of the laser beam emitted therefrom) with their respective focal points located at the aperture of the LD 5. The first collimator lens 11 is so disposed as to have a curvature in the first direction, so that it exerts a refractive power only in the first direction, and not in the second direction. By contrast, the second collimator lens 21 is so disposed as to have a curvature in the second direction, so that it exerts a refractive power only in the second direction, and not in the first direction. The focal length of the first collimator lens 11 with respect to the first direction is represented by fL1, and the focal length of the second collimator lens 21 with respect to the second direction is represented by fL2.

The laser beam emitted from the LD 5 is formed into a parallel beam with respect to the first direction by the first collimator lens 11, and then strikes the first DOE 12. The first DOE 12 makes the laser beam exiting from the collimator lens 11 converge at the convergence position S with respect to the first direction. The focal length of the DOE 12 with respect to the first direction is represented by fD1. The first DOE 12 also converts the intensity distribution of the laser beam exiting from the collimator lens 11 with respect to the first direction so that the laser beam has an even intensity distribution with respect to the first direction at the convergence position S. With respect to the second direction, the DOE 12 acts simply as a transparent plate without making the laser beam exiting from the collimator lens 11 converge nor converting the intensity distribution thereof.

Accordingly, the first shaping optical system 10, constituted of the collimator lens 11 and the DOE 12, acts on the laser beam emitted from the LD 5 only with respect to the first direction as shown in FIG. 2A, and directs the laser beam emitted from the LD 5 to the second shaping optical system 20 without varying the vertical angle θ2 thereof in the second direction as shown in FIG. 2B.

The laser beam exiting from the first shaping optical system 10 is formed into a parallel beam with respect to the second direction by the second collimator lens 21, and then strikes the second DOE 22. The second DOE 22 makes the laser beam exiting from the collimator lens 21 converge at the convergence position S with respect to the second direction. The focal length of the DOE 22 with respect to the second direction is represented by fD2. The second DOE 22 also converts the intensity distribution of the laser beam exiting from the collimator lens 21 with respect to the second direction so that the laser beam has an even intensity distribution with respect to the second direction at the convergence position S. With respect to the first direction, the DOE 22 acts simply as a transparent plate without making the laser beam exiting from the collimator lens 21 converge nor converting the intensity distribution thereof.

Accordingly, the second shaping optical system 20, constituted of the collimator lens 21 and the DOE 22, acts on the laser beam exiting from the first shaping optical system 10 only with respect to the second direction as shown in FIG. 2B, and directs the laser beam exiting from the first shaping optical system 10 to the convergence position S without affecting the convergence thereof with respect to the first direction as shown in FIG. 2A.

Thus, the laser beam emitted from the LD 5 is shaped by the two shaping optical systems 10 and 20 that act independently of each other and is thereby formed into a laser beam having a predetermined cross-sectional outline and having an even intensity distribution both in the first and second directions at the convergence position S. Since the shaping optical systems 10 and 20 act independently, it is easy to design the DOEs 12 and 22 serving as shaping elements. Specifically, it is possible to design the first DOE 12 without giving any consideration to the convergence of the laser beam in the second direction, and it is possible to design the second DOE 22 without giving any consideration to the convergence of the laser beam in the first direction.

Even then, to maximize the evenness of the intensity distribution of the laser beam at the convergence position S both in the first and second directions, it is necessary to determine the positions of the shaping optical systems 10 and 20 appropriately according to the degrees of convergence of the laser beam, i.e. the vertical angles θ1 and θ2 thereof.

Figure 3A:
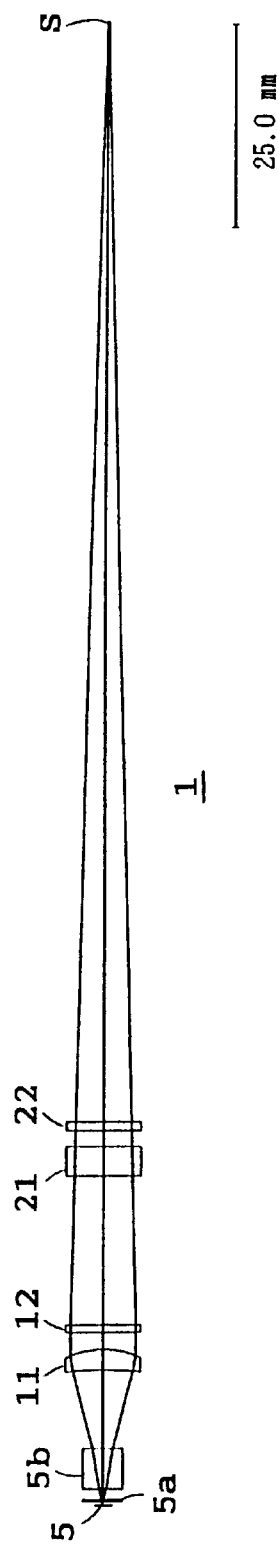
FIGS. 3A and 3B are sectional views, perpendicular to the second and first directions respectively, of a practical example of the laser radiating optical system of the first embodiment.
Figure 3B:
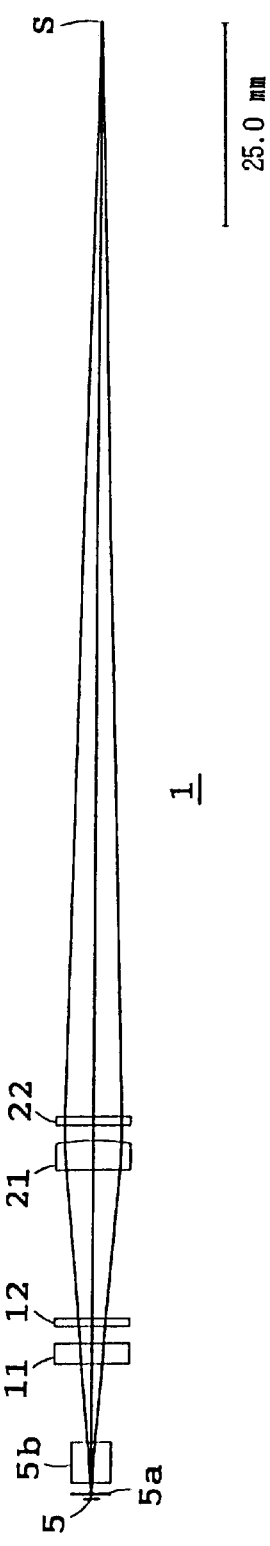

A practical example of the design of the laser radiating optical system 1 will be presented below, taking up, as an example, a case where the laser beam is made to have a substantially square cross section at the convergence position S. FIGS. 3A and 3B show the construction of the laser radiating optical system 1 of this practical example. FIG. 3A is a sectional view perpendicular to the second direction, and FIG. 3B is a sectional view perpendicular to the first direction. For the protection of the LD 5, a thin transparent plate 5a and a transparent block 5b are provided in the vicinity thereof.

Tables 1 and 2 show the construction data of surfaces 0 to 13, i.e. all the optical surfaces existing between the aperture of the LD 5 (referred to as surface 0) and the convergence position S (referred to as surface 13). Hereafter, the optical axis of the LD 5 will be referred to as the Z axis, the axis perpendicular to the Z axis and parallel to the first direction will be referred to as the Y axis, and the axis perpendicular to the Z axis and parallel to the second direction will be referred to as the X axis. Table 1 lists the construction data with respect to the first direction, i.e. as observed on the Y-Z sectional plane, and Table 2 lists the construction data with respect to the second direction, i.e. as observed on the X-Z sectional plane.

The laser beam emitted from the LD 5 has a wavelength of 780 nm, has a vertical angle θ1 of 25.0° in the first direction, and has a vertical angle θ2 of 9.0° in the second direction. The distance L from the LD 5 to the convergence position S is 182 mm. The focal length fL1 of the first collimator lens 11 is 16.5 mm, and the focal length fL2 of the second collimator lens 21 is 39.2 mm. The focal length fD1 of the first DOE 12 is 153 mm, and the focal length fD2 of the second DOE 22 is 130 mm. The first DOE 12 has a diffraction grating having the shape of a square measuring 8.0 mm along each side, and the second DOE 22 has a diffraction grating having the shape of a square measuring 7.0 mm along each side. The area in which an even intensity distribution is obtained at the convergence position S is designed to be a square area measuring 60 µm along each side.

The exit-side surface (surface 6) of the first collimator lens 11 and the exit-side surface (surface 10) of the second collimator lens 21 are anamorphic aspherical surfaces, which are defined by formula (2) below.

$$Dh = Ch \cdot H^2 / [1 + \{1 - (1+Kh) \cdot Ch^2 \cdot H^2\}^{1/2}] + Ah_4 \cdot H^4 + Ah_6 \cdot H^6 + Ah_8 \cdot H^8 + Ah_{10} \cdot H^{10} \quad (2)$$

Here, Dh represents the displacement in the Z-axis direction, Ch represents the curvature (the reciprocal of the radius of curvature) on the Z axis, Kh represents the cone coefficient, and $Ah_4$ to $Ah_{10}$ represent coefficients of orders 4 to 10. The letter h in Dh, Ch, Kh, and Ah represents the Y-axis direction for surface 6 and the X-axis direction for surface 10. H represents the distance in the Y- or X-axis direction from the Z axis. The coefficients $Ah_4$ to $Ah_{10}$ are set to have values as listed in Tables 1 and 2.

The first DOE 12 has a diffraction grating formed on the exit-side surface thereof (surface 8), and the second DOE 22 also has a diffraction grating formed on the exit-side surface thereof (surface 12). These diffraction gratings are designed by first determining a phase function that permits conversion of a Gaussian intensity distribution into an even intensity distribution and then determining a shape function therefrom, taking also the wavelength of the laser beam and the refractive index of the substrates of the DOEs 12 and 22 into consideration.

A phase function is represented as a linear combination of a plurality of terms of different orders, and the coefficients of the individual terms can be calculated by using a non-linear optimization algorism. The phase function of the DOEs 21 and 22 is shown as formula (3) below.

$$\phi(H) = 2\pi/\lambda \cdot (Ch_2 \cdot H^2 \cdot Ch_4 \cdot H^4 + Ch_6 \cdot H^6 + Ch_8 \cdot H^8 + Ch_{10} \cdot H^{10}) \quad (3)$$

Figure 4:
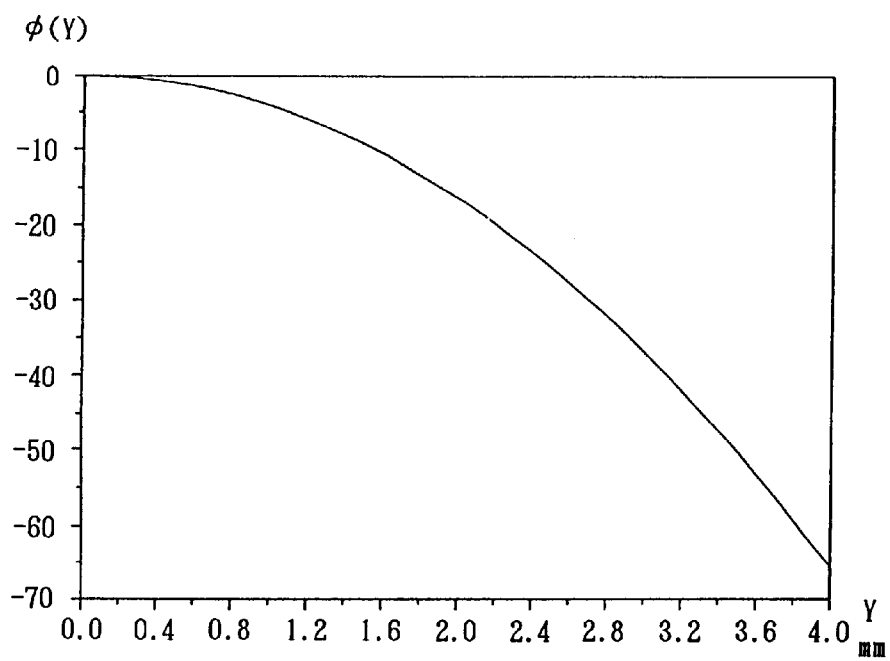
FIG. 4 is a diagram showing the phase function of the first DOE used in the practical example of the first embodiment shown in FIGS. 3A and 3B.

Here, λ represents the wavelength of the laser beam, and $Ch_2$ to $Ch_{10}$ represent the coefficients of orders 2 to 10. The letter h in Ch represents the Y-axis direction for surface 8 and the X-axis direction for surface 12. H represents the distance in the Y- or X-axis direction from the Z axis. The coefficients $Ch_2$ to $Ch_{10}$ are set to have values as listed in Tables 1 and 2. FIG. 4 shows the phase function φ(Y) of the first DOE 12.

The focal lengths fD1 and fD2 of the DOEs 12 and 22 depend on the coefficient $Ch_2$ of order 2, and are defined by formulae (4) and (5) below.

$$fD1 = 1/(-2 \cdot Cy_2) \quad (4)$$

$$fD2 = 1/(-2 \cdot Cx_2) \quad (5)$$

The shape function corresponding to the phase function φ(H) given above as formula (3) is shown as formula (6) below.

$$Z(H) = \phi(H) \cdot \lambda / \{2\pi \cdot (n-1)\} \quad (6)$$

Here, n represents the refractive index of the substrates of the DOEs 12 and 22. The shape function Z(H) has the same form as the phase function φ(H), and defines one continuous anamorphic aspherical surface. By producing an element according to the shape function Z(H), it is possible to obtain a refractive element having a free-form surface.

The laser radiating optical system 1 of the practical example under discussion adopts not the shape function Z(H) exactly as given above as formula (6) but the shape function Z'(H) shown below as formula (7).

$$Z'(H) = \text{modulo} \{\phi(H), 2\pi\} \cdot \lambda / \{2\pi \cdot (n-1)\} \quad (7)$$

Here, "modulo" represents the remainder of the first argument, modulo the second argument. Accordingly, the shape function Z'(H) of formula (7) is a version of the shape function Z(H) of formula (6) normalized with respect to the phase period, and thus the resulting element is a diffractive element having blaze-shaped grooves in the surface thereof. A blazed diffractive element like this can be produced by lithography or electron-beam lithography.

Figure 5:
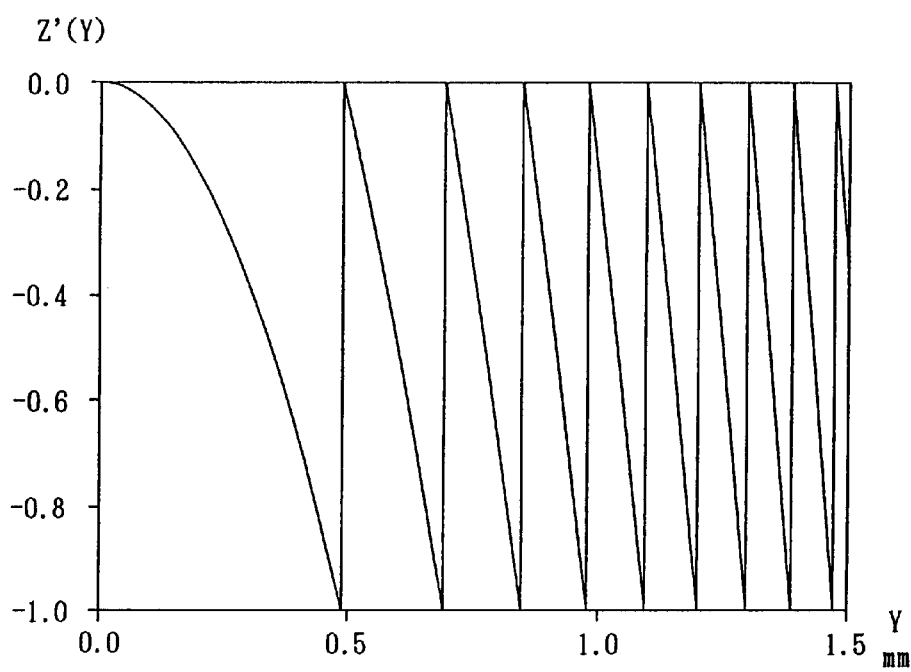
FIG. 5 is a diagram showing the shape function of the first DOE used in the practical example of the first embodiment shown in FIGS. 3A and 3B.

FIG. 5 shows the shape function Z'(Y) of the first DOE 12. FIG. 5 covers the range from the Z axis up to 1.5 mm away therefrom, and uses one period of the phase as the unit of the vertical axis thereof. The thickness of the diffraction grating corresponding to one period is λ/(n−1), which equals 1.72 µm here where the wavelength λ is 780 nm and the refractive index n is 1.45. As will be described later, the DOEs 12 and 22 are designed to have substantially equal numerical apertures, and therefore the phase function φ(X) and the shape function Z'(X) of the second DOE 22 are substantially the same as those shown in FIGS. 4 and 5.

Instead of realizing the shape function Z'(H) exactly as a blazed diffractive element, it is also possible to realize it as a binary diffractive element by dividing the surface of the substrate into a large number of minute regions and varying the height of the substrate surface among $2^k$ (for example, 16) levels at regular intervals so that each region has the level closest to the value of the function Z'(H) as calculated at the center of that region. A binary diffractive element also can be produced by lithography or electron-beam lithography. Moreover, a binary relief can be transferred onto a mold with which to mold glass or plastic. This makes the element easy to mass-produce.

Figure 6:
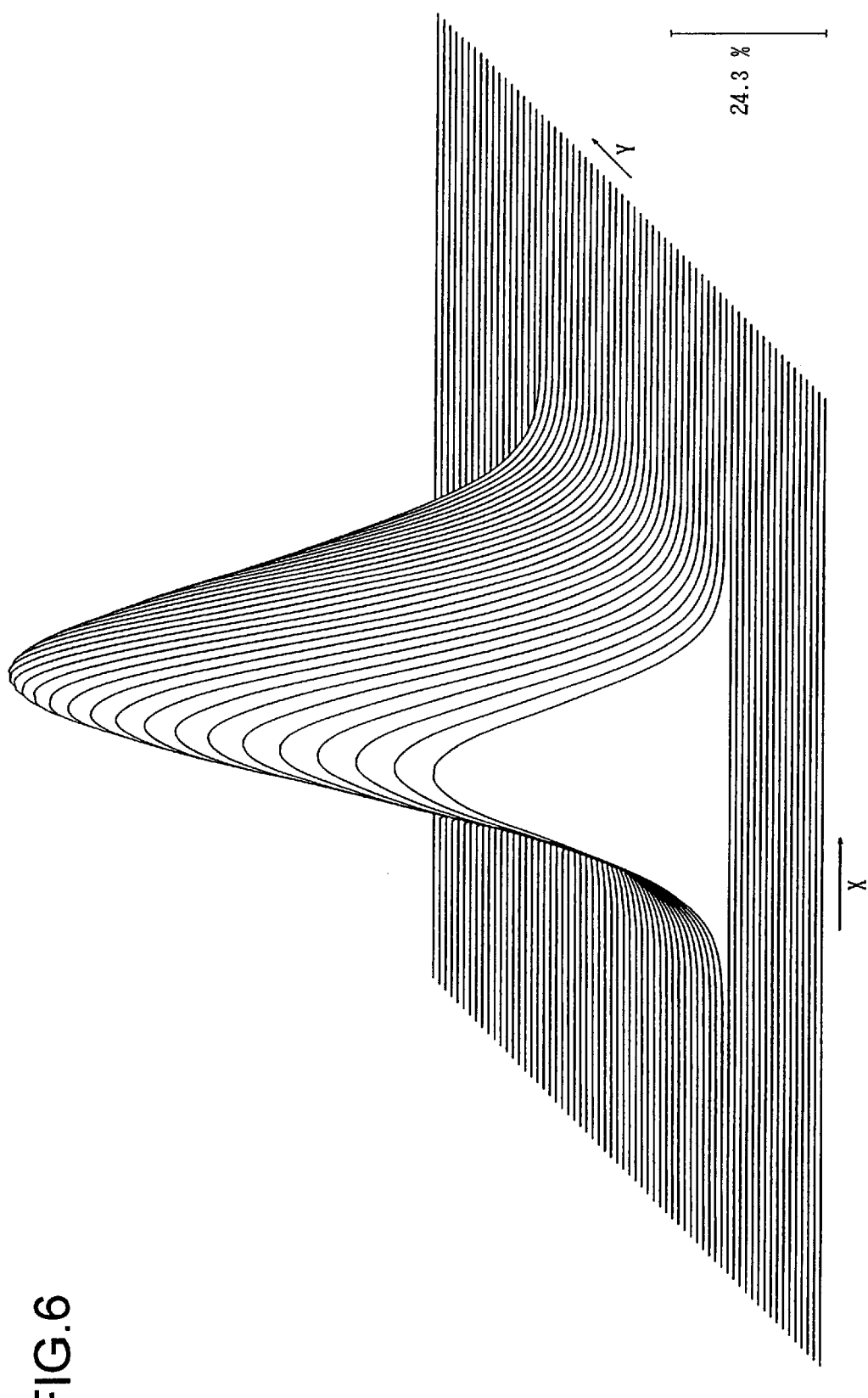
FIG. 6 is a three-dimensional representation of the intensity distribution of the laser beam on the first DOE in the practical example of the first embodiment shown in FIGS. 3A and 3B.
Figures 7A, 7B:
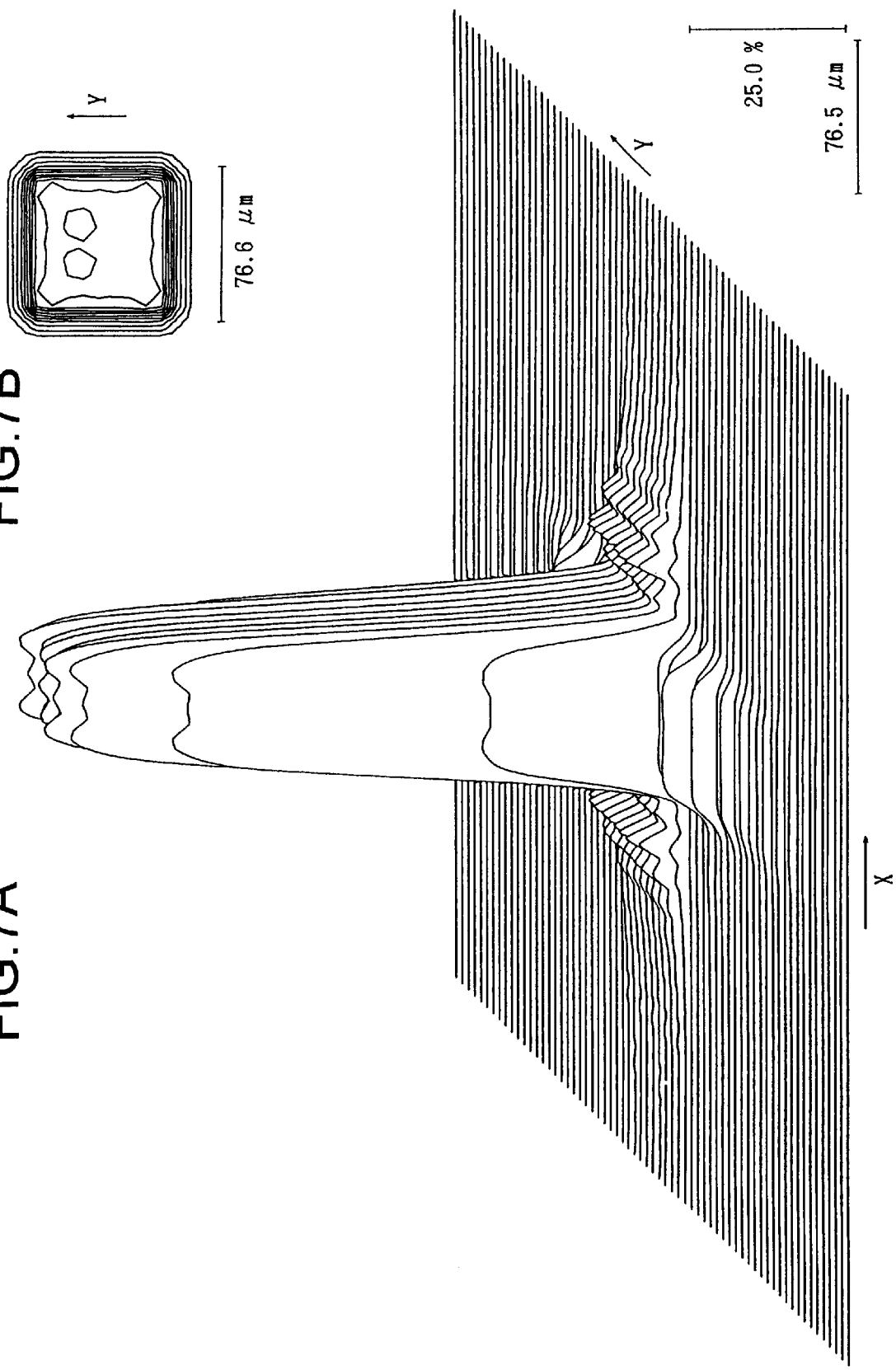
FIGS. 7A and 7B are a three-dimensional representation and a counter map (at 9.1% intervals), respectively, of the intensity distribution of the laser beam at the convergence position in the practical example of the first embodiment shown in FIGS. 3A and 3B.

FIG. 6 shows the intensity distribution of the laser beam as observed on the first DOE 12 in the laser radiating optical system 1 of this practical example, and FIGS. 7A and 7B show the intensity distribution of the laser beam as observed at the convergence position S. The laser beam emitted from the LD 5, originally having a Gaussian intensity distribution and having different beam widths in two mutually perpendicular directions, is formed into a laser beam having a substantially square cross-sectional outline and having an even intensity distribution in both directions. The area in which an even intensity distribution is obtained is, just as designed, a square area measuring 61.5 µm along each side. Moreover, the intensity varies sharply in the peripheral portion, and thus an even intensity distribution is obtained in a large area. As will be clear from comparison between FIGS. 7A and 7B and FIGS. 11A and 11B, the shaping performance of the laser radiating optical system 1 is equal to that of an isotropic optical system that shapes an isotropic laser beam with optimum results.

Now, how to design the first and second shaping optical systems 10 and 20 to obtain a satisfactory intensity distribution as described above will be described with reference to FIGS. 1, 2A, and 2B. As described earlier, the shaping performance of a shaping optical system depends on its exit-side numerical aperture such that, the greater the numerical aperture, the higher the shaping performance.

Accordingly, it is preferable that the first and second DOEs 12 and 22 be designed to have as great numerical apertures as possible and simultaneously have substantially equal numerical apertures with each other so that the intensity distribution is even to the same degree in the first and second directions. Given that the shaping optical systems 10 and 20 need to be arranged between the LD 5 and the convergence position S, the DOEs 12 and 22 can be made to have substantially equal numerical apertures in the following manner.

If the laser beam is shaped first with respect to the direction in which it has a smaller beam width and then with respect to the direction in which it has a lager beam width, i.e. if the second shaping optical system 20 is disposed between the LD 5 and the first shaping optical system 10, it is impossible to make the DOEs 12 and 22 have equal numerical apertures. However, in the laser radiating optical system 1, where the shaping optical system 10 is disposed between the LD 5 and the shaping optical system 20, it is possible to make the DOEs 12 and 22 have equal numerical apertures.

Let the beam width in the first direction as observed on the DOE 12 be D1, and the beam width in the second direction as observed on the DOE 22 be D2. Then, D1 and D2 are given by formulae (8) and (9) below.

$$D1 = 2 \cdot fL1 \cdot \tan(\theta 1/2) \tag{8}$$

$$D2 = 2 \cdot fL2 \cdot \tan(\theta 2/2) \tag{9}$$

The exit-side numerical apertures of the DOEs 12 and 22 are the ratios of half the beam widths on the DOEs 12 and 22 to the focal lengths of the DOEs 12 and 22. Therefore, the numerical apertures NA1 and NA2 of the DOEs 12 and 22 are respectively given by formulae (10) and (11) below.

$$NA1 = D1/(2 \cdot fD1) \tag{10}$$

$$NA2 = D2/(2 \cdot fD2) \tag{11}$$

Accordingly, the ratio of the numerical aperture NA1 of the DOE 12 to the numerical aperture NA2 of the DOE 22 is given by formula (12) below.

$$NA1/NA2 = (D1/fD1)/(D2/fD2) \tag{12}$$

Substituting formulae (8) and (9) in this formula (12) and rearranging the right-hand side of the resulting equation, using formula (13) below for simplification, yields formula (14) below.

$$\beta = \tan(\theta 1/2)/\tan(\theta 2/2) \tag{13}$$

$$NA1/NA2 = \beta \cdot fL1 \cdot fD2/(fL2 \cdot fD1) \tag{14}$$

When the value of formula (14) equals 1, the DOEs 12 and 22 have equal numerical apertures, and thus the shaping performance of the DOE 12 with respect to the first direction is equal to the shaping performance of the DOE 22 with respect to the second direction. Therefore, ideally, it is preferable that formula (15) below be fulfilled.

$$\beta \cdot fL1 \cdot fD2/(fL2 \cdot fD1) = 1 \tag{15}$$

In the practical example described above, the value of formula (14), i.e. NA1/NA2, equals 1.01, and therefore it can safely be said that formula (15) is fulfilled. This makes it possible to obtain a satisfactorily and equally even intensity distribution in the first and second directions at the convergence position S.

Even if formula (15) is not exactly fulfilled, as long as formula (15) is fulfilled approximately, the DOEs 12 and 22 are expected to offer substantially equal shaping performance. To confirm this, simulations were performed substituting different values for the various parameters included in the right-hand side of formula (15). The simulations showed that, as long as the ratio NA1/NA2 of the numerical apertures of the DOEs 12 and 22 was within the range from 0.8 to 1.25, no significant degradation was observed in the shaping performance of either of the DOEs 12 and 22. That is, as long as the relationship represented by formula (1), noted once again below, is fulfilled, a satisfactorily even intensity distribution is obtained within substantially equal widths in the first and second directions.

$$0.8 \leq \beta \cdot fL1 \cdot fD2/(fL2 \cdot fD1) \leq 1.25 \tag{1}$$

Figure 8:
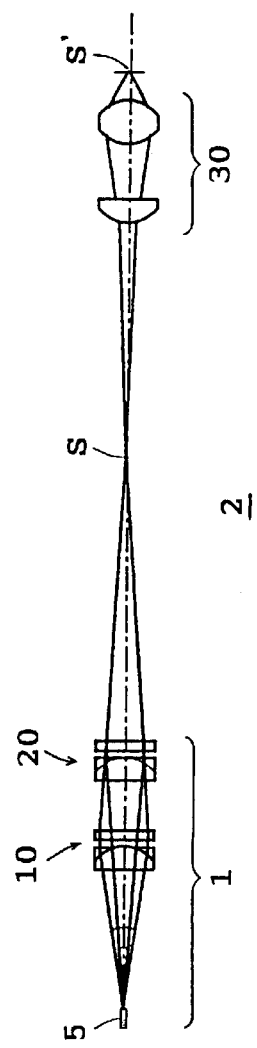
FIG. 8 is a superimposed diagram of sectional views, perpendicular to the first and second directions, of the laser radiating optical system of a second embodiment of the invention.

FIG. 8 schematically shows the outline of the construction of the laser radiating optical system 2 of a second embodiment of the invention and the principle of how a laser beam is shaped therein. The laser radiating optical system 2 incorporates, as a front stage, the laser radiating optical system 1 of the first embodiment, and additionally has, as a rear stage, an optical system 30 that makes the laser beam having traveled past the convergence position S converge once again at a convergence position S'. The optical system 30 is a reduction optical system that makes the laser beam have a still smaller beam width at the convergence position S' than at the convergence position S while maintaining the intensity distribution obtained at the convergence position S.

Figure 9:
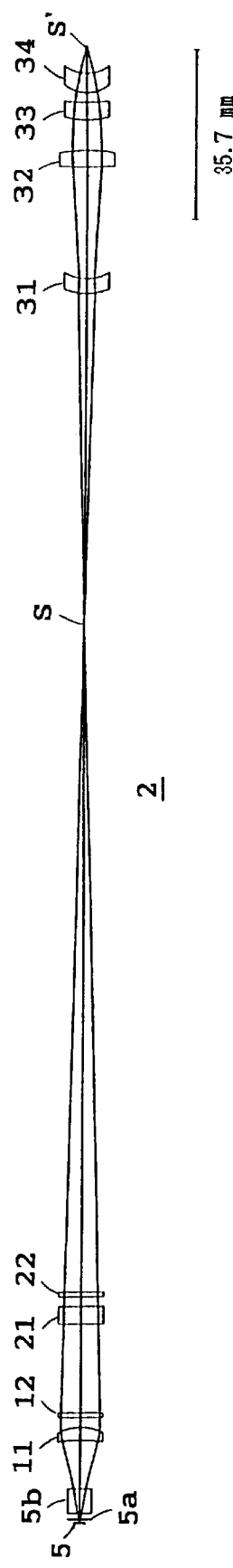
FIG. 9 is a sectional view, perpendicular to the second direction, of a practical example of the laser radiating optical system of the second embodiment.
Figure 10:
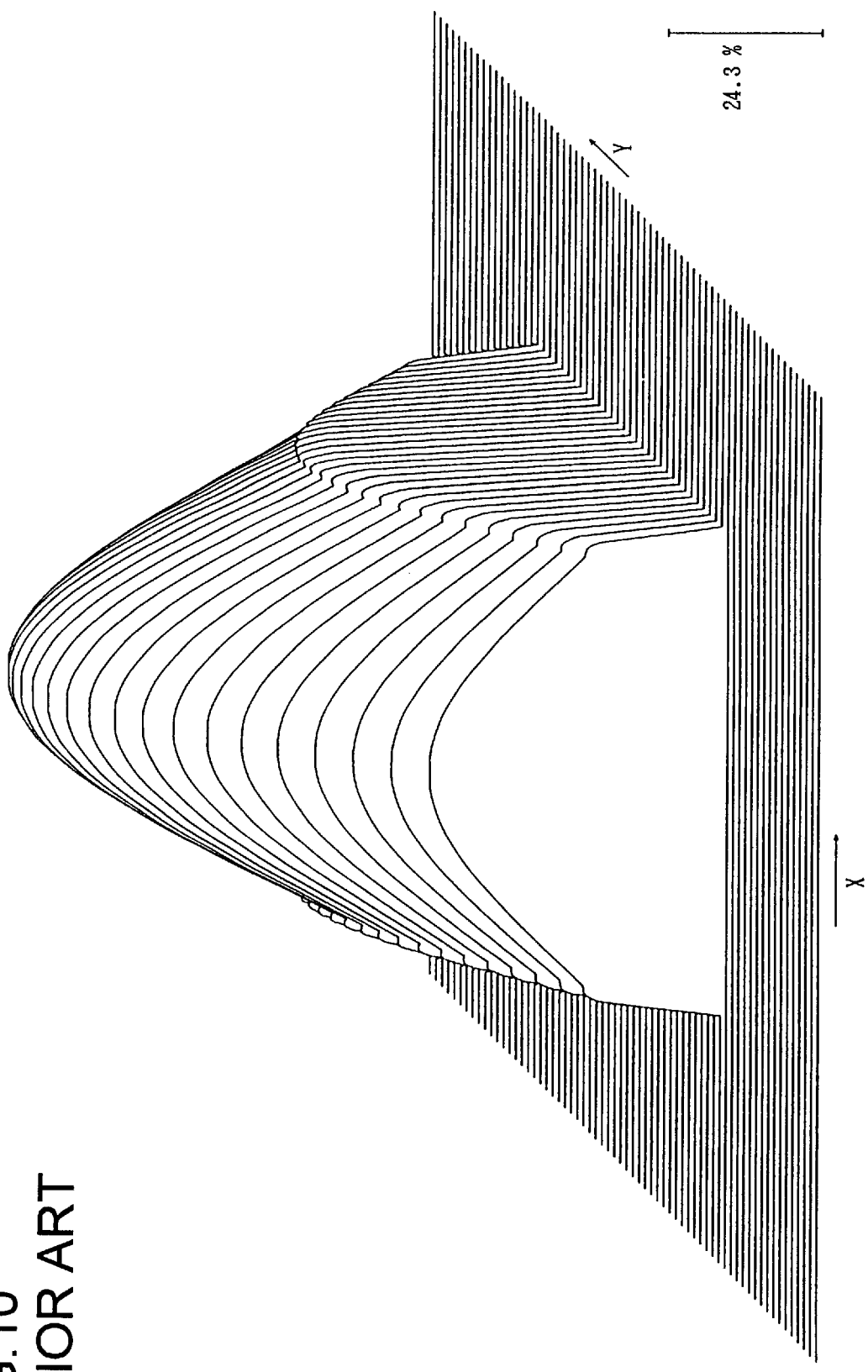
FIG. 10 is a three-dimensional representation of the intensity distribution observed on an isotropic shaping element when it shapes an isotropic laser beam having a comparatively wide beam width.
Figures 11A, 11B:
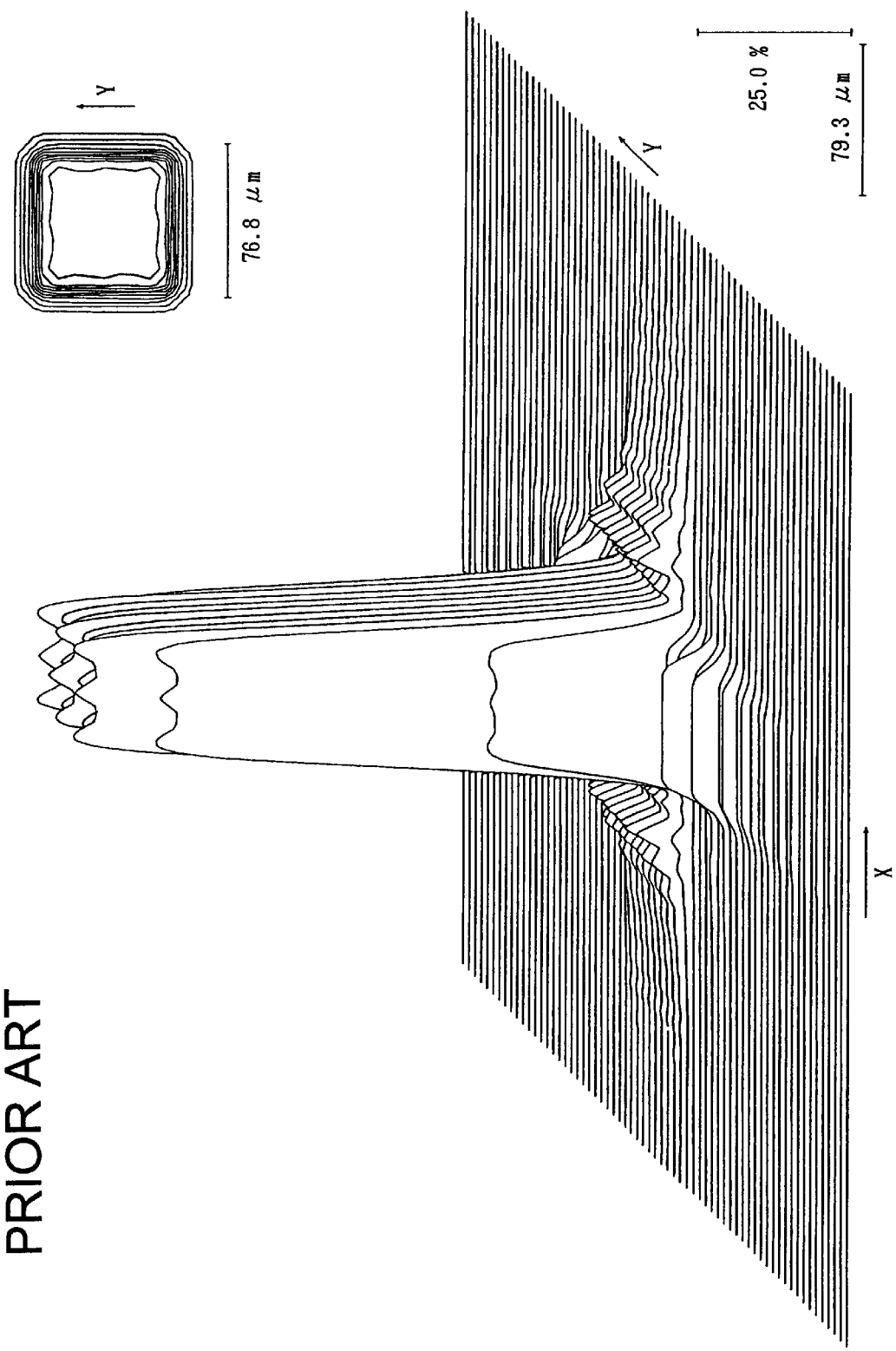
FIGS. 11A and 11B are a three-dimensional representation and a contour map (at 9.1% intervals), respectively, of the intensity distribution of the laser beam shown in FIG. 10 as observed at the convergence position.
Figure 12:
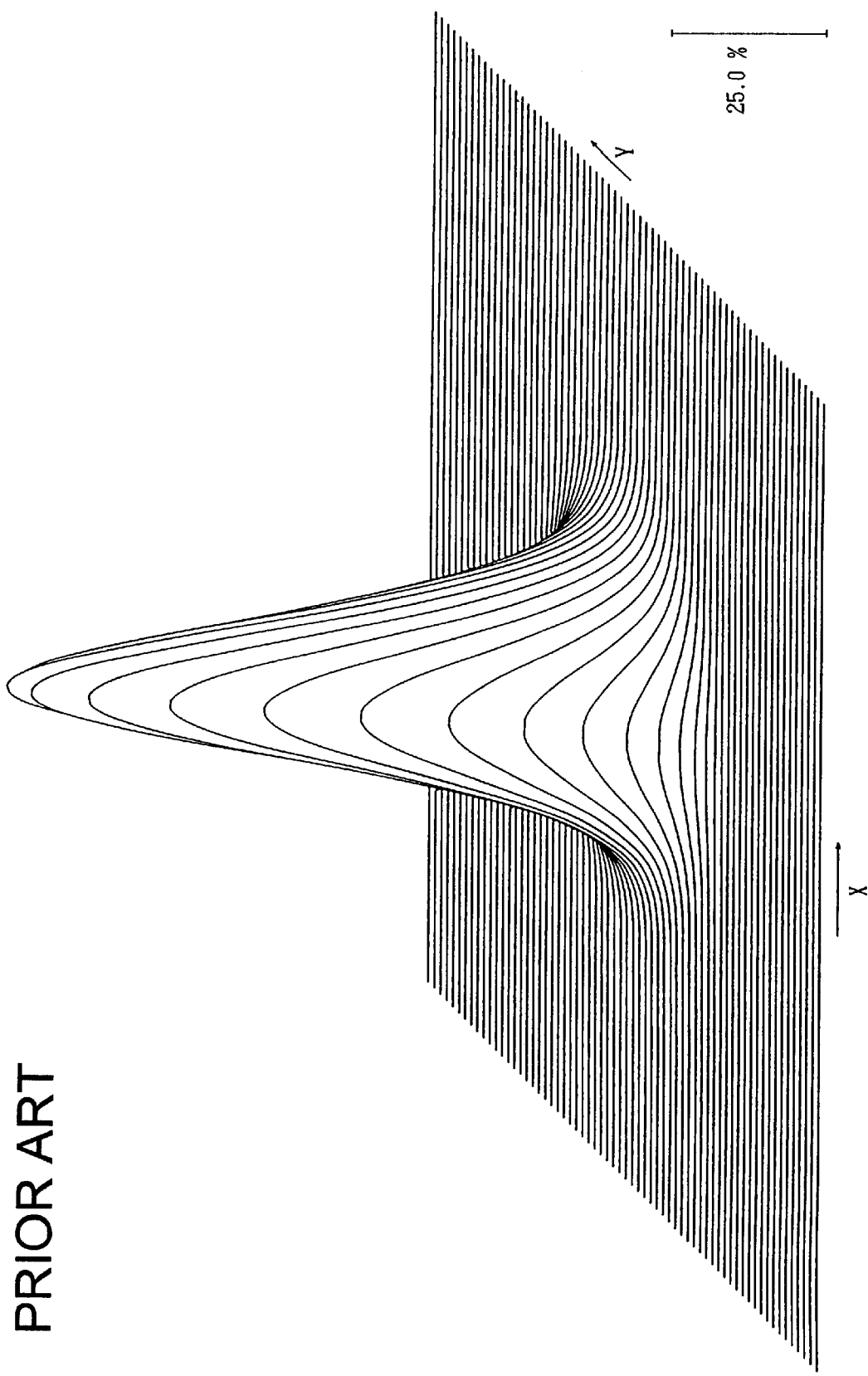
FIG. 12 is a three-dimensional representation of the intensity distribution observed on an isotropic shaping element when it shapes an isotropic laser beam having a comparatively small beam width.
Figures 14A, 14B:
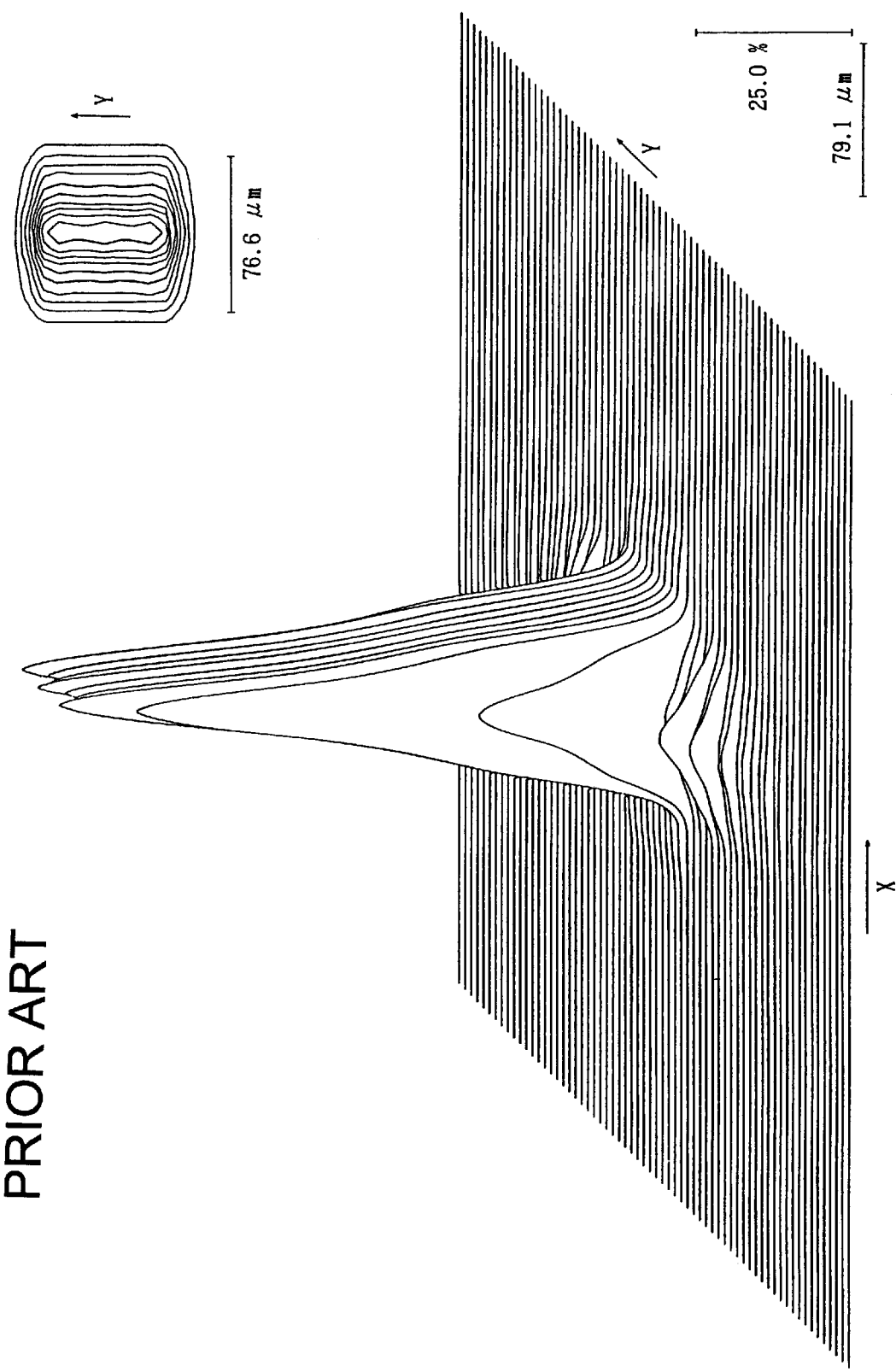
FIGS. 14A and 14B are a three-dimensional representation and a contour map (at 9.1% intervals), respectively, of the intensity distribution of an anisotropic laser beam shaped by an isotropic shaping element as observed at the convergence position.

FIG. 9 shows a practical example of the design of the laser radiating optical system 2. FIG. 9 is a sectional view perpendicular to the second direction. Here, the reduction optical system 30 is symmetric about the optical axis, and thus acts evenly in all directions on the laser beam traveling from the convergence position S.

The portion starting with the LD 5 and ending with the shaping optical system 20, together constituting the front stage, is designed in the same manner as in the practical example described in connection with the first embodiment, and therefore overlapping descriptions will not be repeated. The reduction optical system 30 constituting the rear stage is composed of four lenses 31, 32, 33, and 34. Table 3 shows the construction data of the reduction optical system 30.

As a whole, the reduction optical system 30 has a focal length of 9.0 mm, and acts as an objective lens offering a magnification of 10 times. Accordingly, the square area in which an even intensity distribution is obtained, which measures 61.5 µm along each side at the convergence position S, becomes a square area measuring about 6 µm along each side at the convergence position S'.

In this way, even when a laser beam that has already been made to have an even intensity distribution is made to converge once again so as to have a still smaller beam width, since there is no significant difference in the numerical aperture of the front-stage optical system between the first and second directions, the evenness of the intensity distribution is not spoilt even if the laser beam is handled in an isotropic fashion in the rear-stage optical system. This makes it easy to design the rear-stage optical system to fit the front-stage optical system.

The laser radiating optical systems described heretofore as embodying the present invention all employ a laser diode as a light source. However, the present invention is applicable not only to a laser beam having a Gaussian intensity distribution but also to a laser beam having an intensity distribution expressed by any other function. In that case, the shaping elements are designed according to the function that describes the intensity distribution of the laser beam emitted from the light source used.

Obviously, many modifications and variations of the present invention are possible in light of the above teachings. It is therefore to be understood that within the scope of the appended claims, the invention may be practiced other than as specifically described.

TABLE 1

In the First Direction (on the Y–Z Sectional Plane)

| Surface | Element | Radius of Curvature (mm) | Axial Distance (mm) | Refractive Index Nd |
|---|---|---|---|---|
| 0: | 5 | ∞ | | |
|  | air | | 0.260 | |
| 1: |  | ∞ | | |
|  | 5a | | 0.250 | 1.51118 |
| 2: |  | ∞ | | |
|  | air | | 1.250 | |
| 3: |  | ∞ | | |
|  | 5b | | 5.000 | 1.51118 |
| 4: |  | ∞ | | |
|  | air | | 9.740 | |
| 5: |  | −41.000 | | |
|  | 11 | | 2.500 | 1.82489 |
| 6: |  | −10.500 | | |
|  | air | | 2.000 | |
| 7: |  | ∞ | | |
|  | 12 | | 1.000 | 1.45367 |
| 8: |  | ∞ | | |
|  | air | | 18.262 | |
| 9: |  | ∞ | | |
|  | 21 | | 3.600 | 1.82489 |
| 10: |  | ∞ | | |
|  | air | | 2.000 | |
| 11: |  | ∞ | | |
|  | 22 | | 1.000 | 1.45367 |
| 12: |  | ∞ | | |
|  | air | | 135.138 | |
| 13: | S | ∞ | | |

Anamorphic Aspherical Surface

6:    $Ky = 0$
     $Ay_4 = 0.35983 \times 10^{-4}$    $Ay_6 = 0.27655 \times 10^{-6}$
     $Ay_8 = 0.18736 \times 10^{-8}$    $Ay_{10} = 0.20435 \times 10^{-10}$ Diffraction Grating Surface (Phase Function $\phi$ (Y))

8:    $Cy_2 = -0.32780 \times 10^{-2}$    $Cy_4 = 0.19675 \times 10^{-4}$
     $Cy_6 = -0.11492 \times 10^{-5}$    $Cy_8 = -0.36168 \times 10^{-7}$
     $Cy_{10} = 0.31172 \times 10^{-8}$

TABLE 2

In the Second Direction (on the X–Z Sectional Plane)

| Surface | Element | Radius of Curvature (mm) | Axial Distance (mm) | Refractive Index Nd |
|---|---|---|---|---|
| 0: | 5 | ∞ | | |
|  | air | | 0.260 | |
| 1: |  | ∞ | | |
|  | 5a | | 0.250 | 1.51118 |
| 2: |  | ∞ | | |
|  | air | | 1.250 | |
| 3: |  | ∞ | | |
|  | 5b | | 5.000 | 1.51118 |
| 4: |  | ∞ | | |
|  | air | | 9.740 | |
| 5: |  | ∞ | | |
|  | 11 | | 2.500 | 1.82489 |
| 6: |  | ∞ | | |
|  | air | | 2.000 | |

TABLE 2-continued

In the Second Direction (on the X–Z Sectional Plane)

| Surface | Element | Radius of Curvature (mm) | Axial Distance (mm) | Refractive Index Nd |
|---|---|---|---|---|
| 7: |  | ∞ | | |
|  | 12 | | 1.000 | 1.45367 |
| 8: |  | ∞ | | |
|  | air | | 18.262 | |
| 9: |  | −328.927 | | |
|  | 21 | | 3.600 | 1.82489 |
| 10: |  | −29.587 | | |
|  | air | | 2.000 | |
| 11: |  | ∞ | | |
|  | 22 | | 1.000 | 1.45367 |
| 12: |  | ∞ | | |
|  | air | | 135.138 | |
| 13: | S | ∞ | | |

Anamorphic Aspherical Surface

10:    $Kx = 0$
     $Ax_4 = 0.24968 \times 10^{-5}$    $Ax_6 = 0.23400 \times 10^{-8}$
     $Ax_8 = 0.19149 \times 10^{-11}$    $Ax_{10} = 0.16199 \times 10^{-14}$ Diffraction Grating Surface (Phase Function $\phi$ (X))

12:    $Cx_2 = -0.38376 \times 10^{-2}$    $Cx_4 = 0.29369 \times 10^{-4}$
     $Cx_6 = -0.22406 \times 10^{-5}$    $Cx_8 = -0.92102 \times 10^{-7}$
     $Cx_{10} = 0.10368 \times 10^{-7}$

TABLE 3

In the First and Second Directions (on the Y–Z and X–Z Sectional Planes)

| Surface | Element | Radius of Curvature (mm) | Axial Distance (mm) | Refractive Index Nd |
|---|---|---|---|---|
| 13: | S | ∞ | | |
|  | air | | 71.330 | |
| 14: |  | 12.327 | | |
|  | 31 | | 3.100 | 1.79215 |
| 15: |  | 8.526 | | |
|  | air | | 23.400 | |
| 16: |  | 95.873 | | |
|  | 32 | | 3.800 | 1.79215 |
| 17: |  | −33.148 | | |
|  | air | | 6.200 | |
| 18: |  | 17.045 | | |
|  | 33 | | 3.800 | 1.79215 |
| 19: |  | 59.611 | | |
|  | air | | 2.000 | |
| 20: |  | 7.173 | | |
|  | 34 | | 3.900 | 1.79215 |
| 21: |  | 7.996 | | |
|  | air | | 5.640 | |
| 22: | S' | ∞ | | |

What is claimed is:

1. A laser radiating optical system comprising:
 a laser light source that emits a laser beam having different vertical angles in mutually perpendicular first and second directions and having an uneven intensity distribution;
 a first shaping optical system including a first collimator lens that forms the laser beam exiting from the laser light source into a parallel beam with respect to the first direction and a first shaping element that converts the intensity distribution of the laser beam exiting from the first collimator lens with respect to the first direction and that simultaneously makes this laser beam converge at a convergence position, a predetermined distance away from the laser light source with respect to the first direction; and a second shaping optical system including a second collimator lens that forms the laser beam exiting from the laser light source into a parallel beam with respect to the second direction and a second shaping element that converts the intensity distribution of the laser beam exiting from the second collimator lens with respect to the second direction and that simultaneously makes this laser beam converge at a convergence position a predetermined distance away from the laser light source with respect to the second direction.

2. A laser radiating optical system as claimed in claim 1, wherein the convergence position of the first shaping element and the convergence position of the second shaping element are identical.

3. A laser radiating optical system as claimed in claim 2, wherein, when the vertical angle of the laser beam in the first direction is larger than the vertical angle thereof in the second direction, the first shaping optical system is disposed closer to the laser light source than the second shaping optical system is.

4. A laser radiating optical system as claimed in claim 3, wherein, when it is assumed that the vertical angle of the laser beam in the first direction is $\theta 1$, that the vertical angle of the laser beam in the second direction is $\theta 2$, that the first collimator lens has a focal length $fL1$, that the second collimator lens has a focal length $fL2$, that the first shaping element has a focal length $fD1$, and that the second shaping element has a focal length $fD2$, and in addition $\beta$ is defined as $\beta = \tan(\theta 1/2)/\tan(\theta 2/2)$, then the following relationship is fulfilled:

$$0.8 \leq \beta \cdot fL1 \cdot fD2/(fL2 \cdot fD1) \leq 1.25.$$

5. A laser radiating optical system as claimed in claim 2, further comprising:
an optical system that makes the laser beam having traveled past the convergence position converge once again.

6. A laser radiating optical system as claimed in claim 1, wherein, when the vertical angle of the laser beam in the first direction is larger than the vertical angle thereof in the second direction, the first shaping optical system is disposed closer to the laser light source than the second shaping optical system is.

7. A laser radiating optical system as claimed in claim 1, wherein the first shaping element is a diffractive element of a surface relief type.

8. A laser radiating optical system as claimed in claim 1 wherein the first shaping element is a refractive element having an anamorphic aspherical surface.

9. A laser radiating optical system as claimed in claim 1 wherein the laser light source is a laser diode.

* * * * *